(12) United States Patent
Combs

(10) Patent No.: US 6,724,071 B2
(45) Date of Patent: Apr. 20, 2004

(54) MOLDED PLASTIC PACKAGE WITH HEAT SINK AND ENHANCED ELECTRICAL PERFORMANCE

(75) Inventor: Edward G. Combs, Foster City, CA (US)

(73) Assignee: ASAT, Limited, Tsuen Wan (HK)

( * ) Notice: Subject to any disclaimer, the term of this patent is extended or adjusted under 35 U.S.C. 154(b) by 4 days.

(21) Appl. No.: 10/269,332

(22) Filed: Oct. 11, 2002

(65) Prior Publication Data

US 2003/0038382 A1 Feb. 27, 2003

Related U.S. Application Data

(63) Continuation of application No. 09/737,993, filed on Dec. 14, 2000, which is a continuation of application No. 08/116,305, filed on Sep. 3, 1993, now Pat. No. 6,326,678.

(51) Int. Cl.⁷ .............................................. H01L 23/552
(52) U.S. Cl. ...................... 257/666; 257/675; 257/676
(58) Field of Search ................................ 257/787, 666, 257/675, 670, 669

(56) References Cited

U.S. PATENT DOCUMENTS

| 4,891,687 A | 1/1990 | Mallik et al. |
|---|---|---|
| 4,975,761 A | 12/1990 | Chu |
| 4,994,897 A | 2/1991 | Golubic et al. |
| 5,012,386 A | 4/1991 | McShane et al. |
| 5,105,259 A | 4/1992 | McShane et al. |
| 5,138,430 A | 8/1992 | Gow, 3rd et al. |
| 5,172,213 A | 12/1992 | Zimmerman |
| 5,227,662 A | 7/1993 | Ohno et al. |
| 5,278,446 A | 1/1994 | Nagaraj et al. |

FOREIGN PATENT DOCUMENTS

| JP | 5526630 | 2/1980 |
|---|---|---|
| JP | 55 140252 | 11/1980 |
| JP | 55 162246 | 12/1980 |
| JP | 6276747 | 4/1987 |
| JP | 439957 | 2/1992 |
| JP | 4137756 | 5/1992 |
| JP | 4280661 | 10/1992 |

*Primary Examiner*—Roy Potter
(74) *Attorney, Agent, or Firm*—Gallagher & Lathrop; Thomas A. Gallagher

(57) ABSTRACT

A molded plastic package for semiconductor devices incorporating a heat sink, controlled impedance leads and separate power and ground rings is described. The lead frame of the package, separated by a dielectric layer, is attached to a metal heat sink. It has more than one ring for power and ground connections. The die itself is attached directly onto the heat sink through a window on the dielectric and provides high power dissipation. The package is molded using conventional materials and equipment.

18 Claims, 5 Drawing Sheets

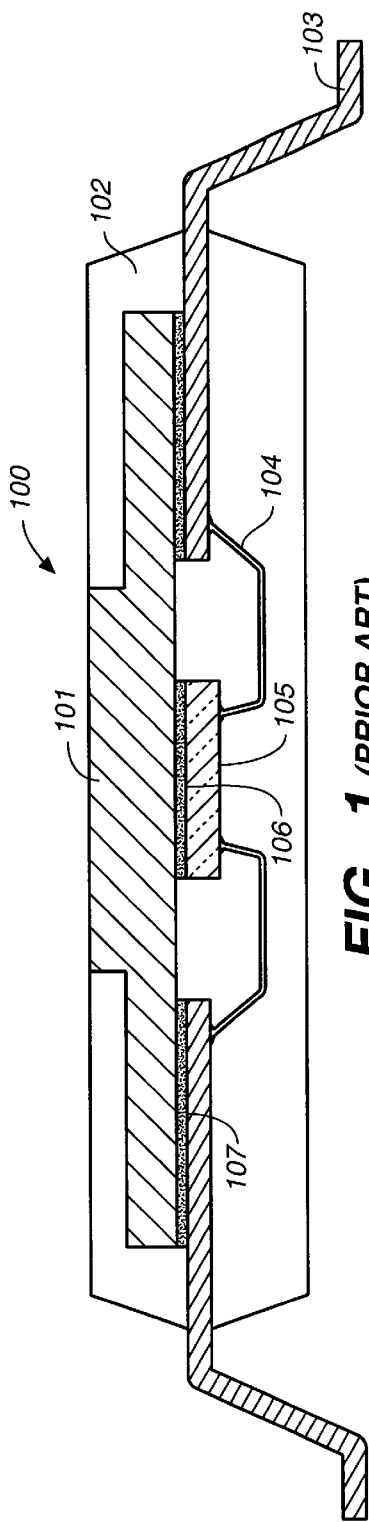
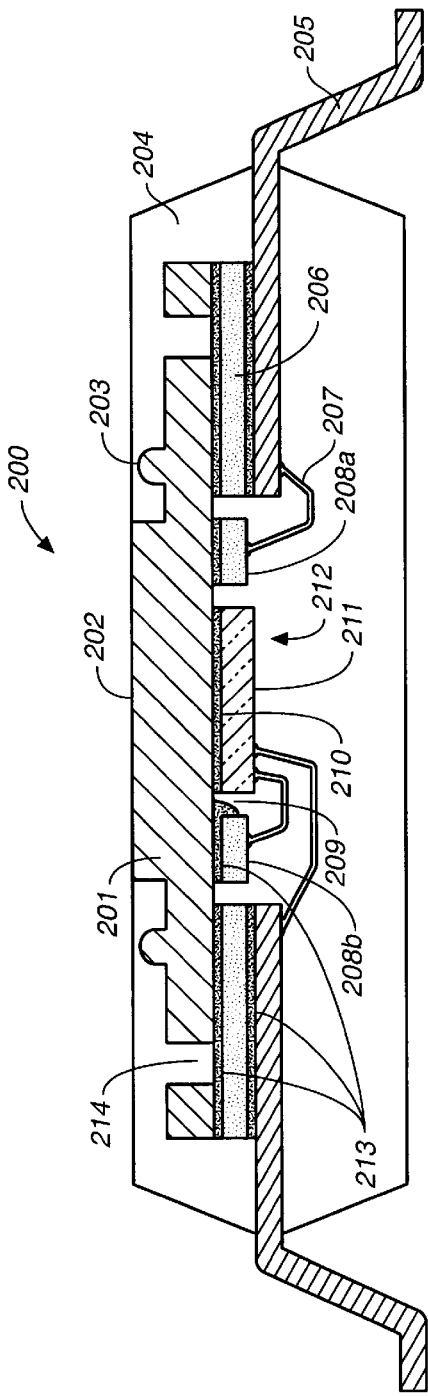
FIG._1 (PRIOR ART)
FIG._2

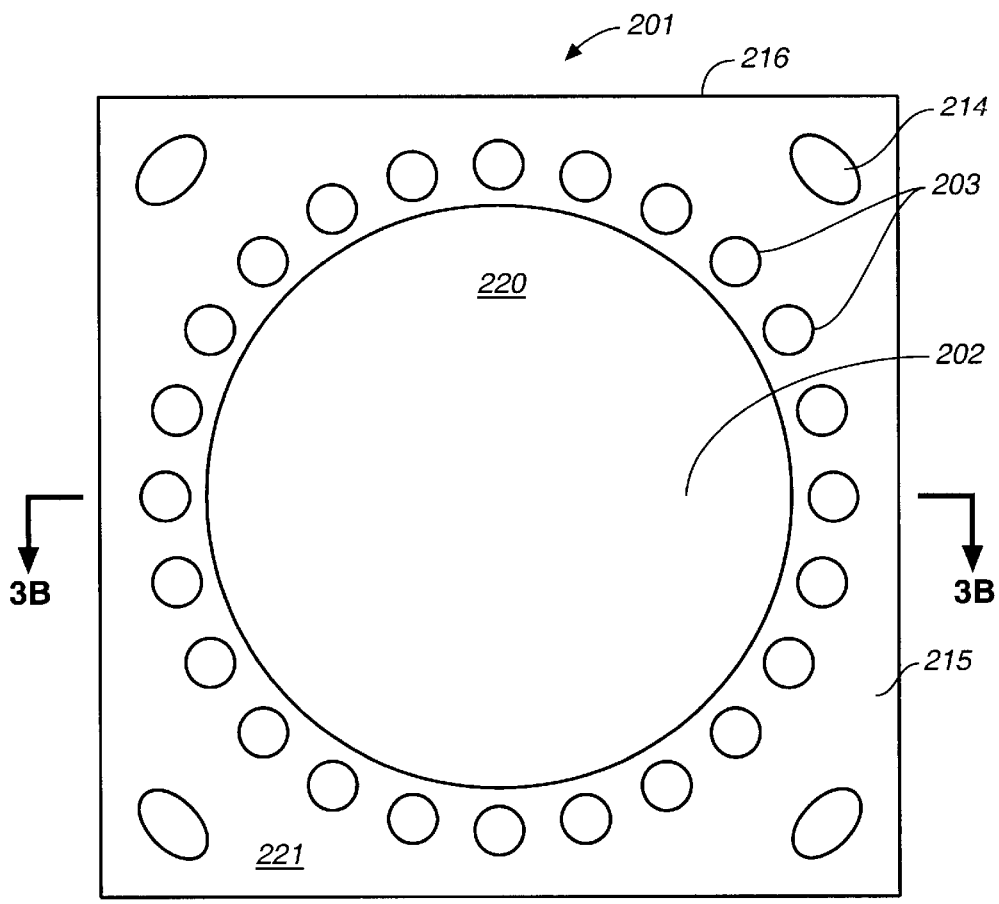
FIG._3a
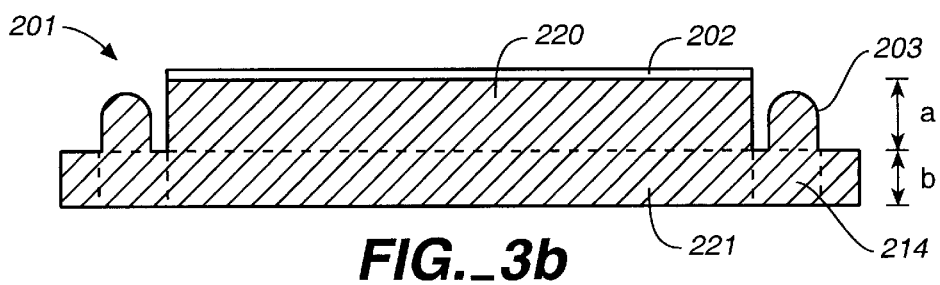
FIG._3b

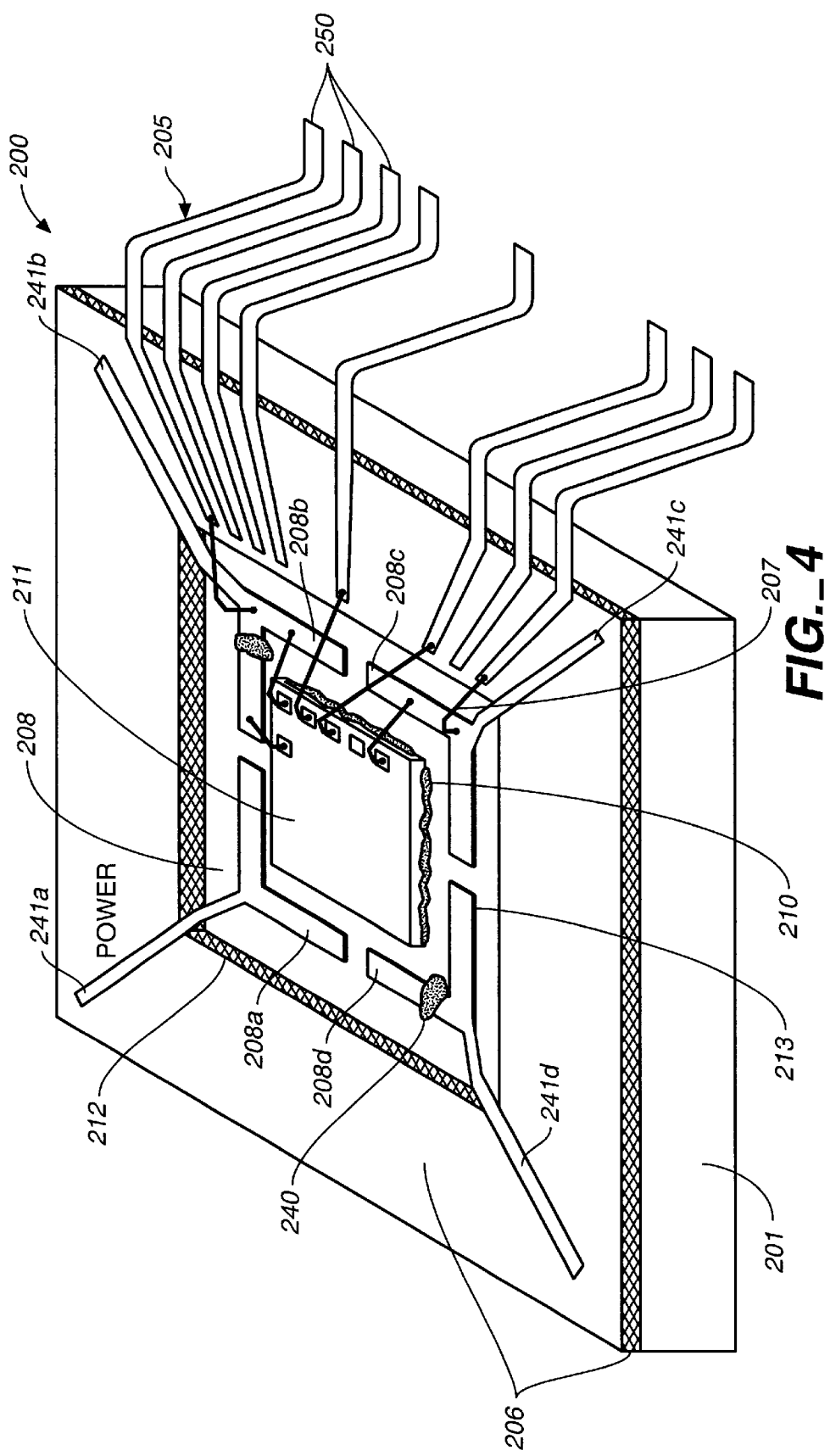
FIG._4

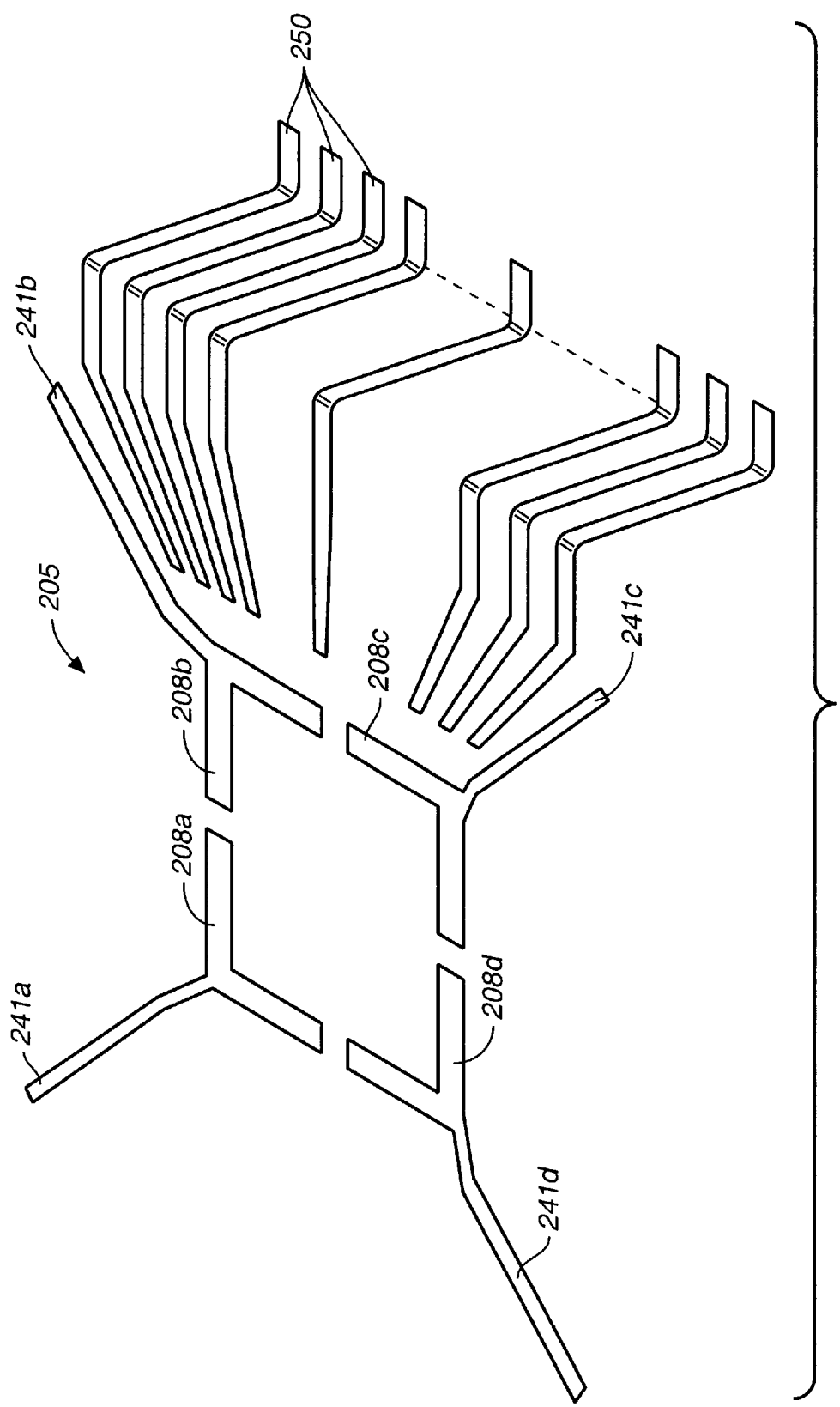
FIG._5

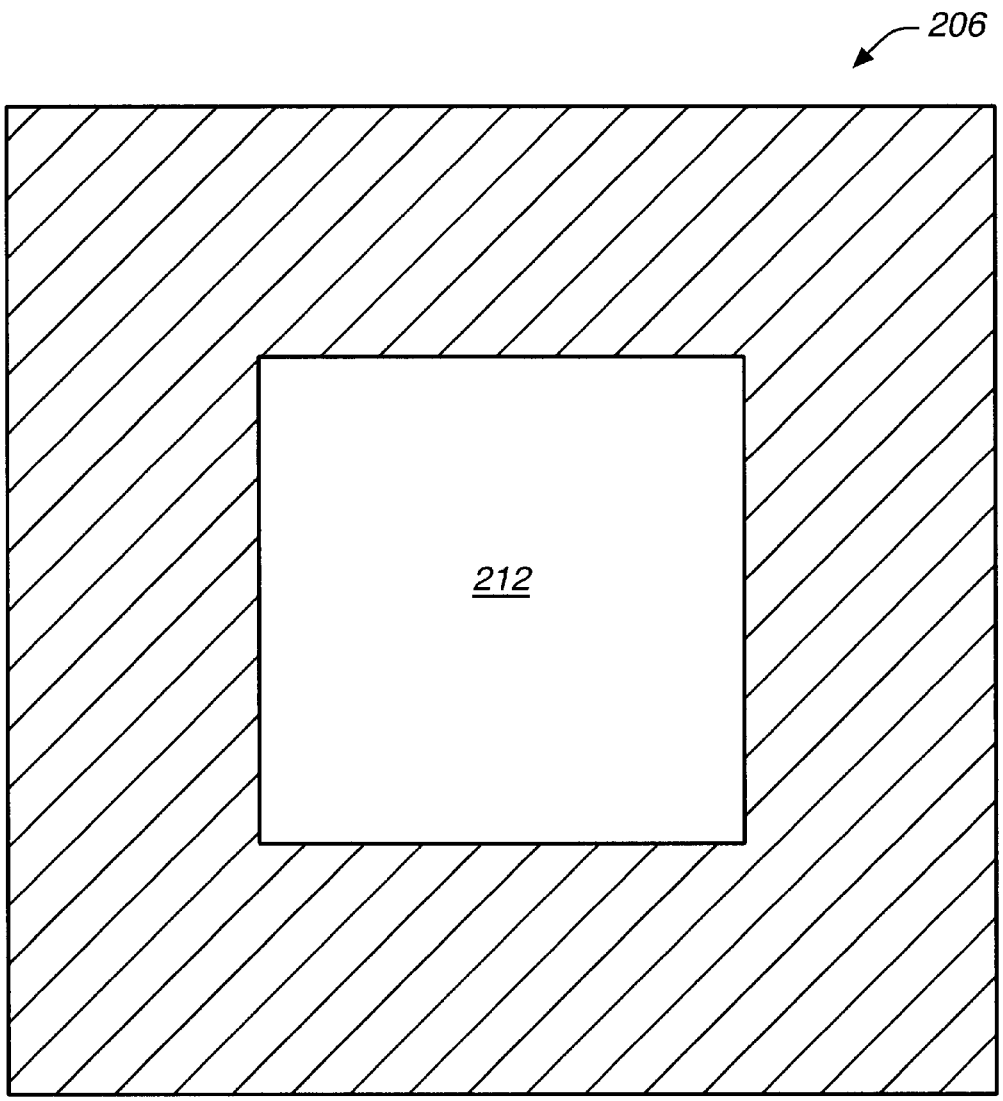
FIG._6

MOLDED PLASTIC PACKAGE WITH HEAT SINK AND ENHANCED ELECTRICAL PERFORMANCE

BACKGROUND OF THE INVENTION

1. Field of the Invention

The present invention relates to the design of a semiconductor package; and, in particular, the present invention relates to a semiconductor package designed for high electrical and thermal dissipation performances.

2. Discussion of the Related Art

Semiconductor devices are becoming larger, integrating a larger number of circuits, and operating at increasingly higher clock frequencies. As a result, semiconductor devices are requiring, without compromising reliability, packages of increasingly higher lead count, and higher electrical and thermal performances.

In the prior art, conventional plastic molded packages can dissipate up to 2 watts of power. With some improvements in the lead frame, and by adding a heat spreader or heat sink, a plastic molded package can dissipate up to 4 watts. A further improvement in power dissipation can be achieved by attaching the semiconductor device, also called the semiconductor "die", onto an integral heat sink. Such a heat sink typically has a surface exposed to the ambient to conduct heat away from the package. An example of such a package, also called a "thermally enhanced" package, is shown in FIG. 1.

FIG. 1 shows a thermally enhanced package comprising a semiconductor die 105 attached by a layer of thermally conductive epoxy to a metallic heat sink 101. The input and output terminals of semiconductor die 105 are electrically coupled to connection terminals ("leads") of a lead frame 103 by wire bonds 104, which connect the bonding pads of semiconductor die 105 to individual leads in lead frame 103. Lead frame 103 attaches to heat sink 101 by a layer of dielectric adhesive 107. The thermally enhanced package is encapsulated in a plastic molding 102. In package 100, high thermal dissipation is achieved by attaching semiconductor die 105 directly onto the lower surface of heat sink 101 using a thermally conductive epoxy layer 106.

Although plastic molded packages are typically of high reliability, the incorporation of a heat sink in a thermally enhance plastic molded package, such as package 100 of FIG. 1, leads to failures which are directly related to the design and the material used in the heat sink. For example, heat sink 101 is often made of aluminum. The large difference between the thermal expansion coefficients (TCE) of the silicon die, at 3 ppm/° C., and of aluminum, at 25 ppm/° C. induces significant strain on semiconductor die 105. Such strain causes die-cracking and thus a package failure. For this reason, in the prior art, semiconductor die sizes are kept well below 10×10 mm to minimize the induced stress. Alternatively, a heat sink material with lower TCE can be chosen to minimize the large mismatch in the heat sink's and the semiconductor die's coefficients of thermal expansion.

A similar mismatch in TCEs exists between heat sink 101 and the plastic molding 102. Typically, a plastic molding compound has a TCE of about 17 ppm/° C. The thermal cycle package 100 experiences during assembly and normal operations induces high stress at the metal-to-molding interface (i.e. between heat sink 101 and plastic molding 102) which can lead to delamination, cracking of the molding, and die failures. For this reason, a close matching of the TCEs of heat sink 101 to plastic molding 102 is very desirable.

During the assembly of package 100, plastic molding 102 shrinks significantly after the molding operation and during post-mold curing, which is typically carried out at or about 175° C. The shrinking molding causes significant stress at the metal-to-molding interface, which can lead to delamination. Delamination is very undesirable and usually causes long-term reliability failures. Delamination can be minimized by including on the heat sink "locking" features, which strengthen mold adhesion, and by choosing a heat sink material with a TCE closer to that of the molding compound.

In the prior art, frequency performance is limited by the electrical parasitic impedances of the lead frame to 50 MHz or less. The lead frame usually consists of a single metal layer without the ability to provide controlled impedance connections. U.S. Pat. No. 4,891,687, entitled "Multilayer Molded Plastic IC Package", to Mallik et al, filed on January 27, and issued on Jan. 2, 1990, discloses a package achieving a high electrical performance. However, the package disclosed in U.S. Pat. No. 4,891,687 requires two lead frames, and hence, such package is significantly more costly than a conventional plastic molded package.

Furthermore, the prior art's use of long wire bonds between the semiconductor die and the lead frame increases the impedances of ground connections. A high impedance to a ground connection results in "ground bounce" and other electrical noises which further restrict the overall electrical performance of the conventional plastic molded package. In logic semiconductor devices, which usually require high lead counts, about 25% of the leads in each package are used for power and ground connections. The large number of leads devoted to power and ground connections significantly reduces the number of pins available for signal connections, which usually determine the level of available performance.

SUMMARY OF THE INVENTION

In accordance with the present invention, a plastic molded package is provided comprising (i) a heat sink having an upper surface and a lower surface, (ii) a ceramic or dielectric ring attached by an adhesive film to the lower surface of the heat sink; (iii) a semiconductor die attached using a thermally conductive epoxy adhesive to the lower surface of the heat sink through an aperture in the dielectric ring; (iv) a lead frame, which is attached to a surface of the dielectric ring, having a number of leads extending outside of the plastic molded package; and (v) a plastic molding enclosing the ceramic ring, the lead frame, except at the exposed portion of the leads and the semiconductor die.

In accordance with one aspect of the invention, the heat sink comprises a base portion enclosed in the encapsulation and a raised portion protruding above the base portion having a surface exposed to the ambient. In one embodiment, the exposed surface of the raised portion is free of corners (e.g. in the shape of a circle). The base portion of the heat sink includes a number of conical protrusions enclosed in the molding, and a number of through holes filled by the molding. The exposed portion of the raised surface of the heat sink is coated with nickel to provide a good conductive surface for attaching an external heat sink. Suitable materials for the heat sink includes oxygen free high conductivity copper, copper/molybdenum/copper laminate, copper/tungsten/copper laminate and beryllium composites.

In accordance with another aspect of the present invention, the lead frame of the plastic molded package further comprises an interposer ring downset and attached to the heat sink. The interposer ring comprises either a single loop (360°), or a number of electrically isolated sections for independent connections to power and ground terminals. Such electrically isolated sections of the interposer ring can be supported in the encapsulation by tie bars of the lead frame. For an electrically isolated section of the interposer ring, an electrical short to the heat sink allows the heat sink to be used as a ground plane for the semiconductor die. That electrical short can be accomplished by a drop of electrically conductive adhesive. The leads of the lead frame allow the internal power and ground planes in the interposer ring to be connected to power and ground supplies outside of the plastic molded package.

In accordance with another aspect of the present invention, the dielectric ring comprises a material selected from the group consisting ceramic materials, epoxy materials including Ablefilm 564AKHM, and a dielectric sheet material sold under the trade name of Neoflex. A ceramic dielectric ring provides higher thermal conductivity than the other materials. Thus, the heat from the semiconductor die can be conducted through the wire bonds to the heat sink, rather than through the leads to the ambient, which is a path of much higher thermal impedance. Consequently, the package of the present invention provides higher performance in power dissipation.

In a package of present invention, an 8-watt thermal performance is achieved by adding the combination of the ceramic dielectric ring and an integral heat sink made out of oxygen-free high-conductivity copper (OFHC). Since copper's TCE is 17 ppm/° C., which is significantly less than aluminum's TCE, the package of the present invention can attach a larger die than the prior art (e.g. up to 14×14 mm) without the risk of a die-cracking failure. Furthermore, in the present invention, the combined effects of the unique locking features on the integral heat sink, and the close matching of TCEs between copper and the molding compound, eliminate delamination and cracking failures modes observed in aluminum heat sinks of the prior art.

Further, by providing controlled impedance traces and separate power and ground rings on the lead frame, electrical performance in the packages of the present invention is significantly enhanced over the prior art. Controlled impedance is achieved by connecting the heat sink to electrical ground and using the heat sink as an electrical ground plane. By attaching a ceramic ring of an appropriate thickness as a dielectric layer between the heat sink and the lead frame, an impedance in the range of 40–60 ohms is achieved. Such controlled impedance provides high frequency performance in the range of 100 MHz.

The power and ground rings in a package of the present invention are provided separately to allow low impedance connections between the semiconductor die and the leads. Such low impedance connections are achieved by retaining only a peripheral part of a conventional die attach pad either as an entire ring or divided into two or more sections. In one embodiment, the entire ground ring is electrically shorted to the heat sink. Alternatively, in a second configuration, the two or more sections of the retained peripheral part of the die attach pad are each shorted to either a ground plane (e.g. the heat sink) or one or more power terminals. Such a configuration has lower inductance than the prior art leads because the wire bonds to the rings are shorter, and because the rings have a larger width than the leads. Furthermore, since most of the power and the ground connections are internal to the package, the available lead count for signal transmission is significantly increased. The higher lead count allows higher performance and achieves a cost which compares favorably with a conventional package of comparable performance.

The present invention is better understood upon consideration of the detailed description below and the accompanying drawings.

BRIEF DESCRIPTION OF THE DRAWINGS

FIG. 1 is a cross sectional view of thermally enhanced package 100 of the prior art.

FIG. 2 is a cross sectional view of a package 200, in accordance with the present invention.

FIG. 3a is a top view of heat sink 201 of FIG. 2.

FIG. 3b is a cross sectional view of heat sink along the dotted labelled A–A' in FIG. 3a.

FIG. 4 is a bottom view of package 200 with plastic 204 molding removed to show lead frame 205.

FIG. 5 is a schematic view of the lower side of the lead frame with the interposer ring sections.

FIG. 6 is a top view of ceramic ring 206.

DETAILED DESCRIPTION OF THE PREFERRED EMBODIMENTS

The present invention relates to a package for encasing a semiconductor device. Such a package facilitates electrical connections between a semiconductor device and an external printed circuit board (PCB). The package of the present invention provides higher thermal dissipation and higher electrical performance than conventional plastic molded packages. The package of the present invention uses materials and design features that significantly improve the performance of the package without compromising reliability.

FIG. 2 is a cross sectional view of a package 200, in accordance with the present invention. As shown in FIG. 2, a semiconductor die 211 is attached by a film of thermally conductive epoxy 210 to a thick copper heat sink 201. An annular ceramic ring 206 is attached by dielectric adhesive 213 onto heat sink 201 on one surface of ceramic ring 206 and onto a lead frame 205 on an opposite surface of ceramic ring 206. Package 200 forms a transmission line for each lead in lead frame 205, with heat sink 201 acting as a ground plane. In addition, lead frame 205 includes an interposer ring 208 which surrounds semiconductor die 211 inside the window 212 of ceramic ring 206. In this embodiment, interposer ring 208 is severed into four sections 208a–208d to allow independent connections to the power and ground terminals.

In this embodiment, lead frame 205 is a copper lead frame having leads which are each 6 mils wide and 5 mils thick. Lead frame 205 can also be constructed from other conductive materials, e.g. alloy 42. Ceramic ring 206 is 10 mils thick, and the dielectric layers attaching heat sink 201 and lead frame 205 to the surfaces of ceramic ring 206 are each about 1 mil thick. Dielectric ring can be constructed from a ceramic material, an epoxy such as Ablefilm 564AKHM, or a dielectric sheet material sold under the trade name of Neoflex. Under this configuration, each lead can be considered a 40–60 ohm transmission line capable of applications requiring a clock frequency of up to 100 MHz.

Heat sink 201 is made out of oxygen-free high-conductivity (OFHC) copper. Other suitable materials for heat sink 201 include copper/molybdenum/copper laminate, copper/tungsten/copper laminate and beryllium composites. The back surface of semiconductor die 211 is attached to heat sink 201 via thermally conductive epoxy 210. Although the thermal coefficient of expansion (TCE) of copper is significantly higher than the TCE of silicon, the flexible nature of epoxy 211 provides the compliance necessary to prevent die cracking from differential thermal expansion for semiconductor dies up to an area about 14×14 mm. Furthermore, since copper has the high thermal conductivity of 0.934 cal-cm/cm$^2$-sec-° C., heat sink 201 provides high power dissipation. Further, since copper's TCE is approximately 17 ppm/° C., the TCE of heat sink 201 is well matched to the TCEs of most molding compound materials, which are typically in the range of 16–17 ppm/° C. The well-matched TCEs at the heat sink-molding interface minimize stress, thereby causing no delamination even during thermal cycling or thermal shock tests. The top surface of heat sink 201, which is exposed to the ambient, is plated with a film 202 of nickel to provide a clean surface (i.e. free of copper oxides) for attaching an external heat sink, if needed.

In the present embodiment, adhesion of heat sink 201 to molding 204 is enhanced by a thin layer of copper oxide at the interface between heat sink 201 and plastic molding 204. The copper oxide at the heat sink-molding interface, which is formed by annealing copper at 300° C. for one hour, has good adhesion to molding compounds.

FIG. 3a is a top view (i.e. viewed above the surface coated by nickel film 202) of heat sink 201. In the embodiment shown in FIG. 3a, heat sink 201 has a number of mold-locking features to maximize the adhesion of heat sink 201 to plastic molding 204. First, heat sink 201 which, as shown, is suitable for use with a 208-lead package. In this embodiment, heat sink 201 is a 1 inch by 1 inch square (i.e. measures 1 inch at side 216 of FIG. 3a) with a central raised portion 220 which provides a 0.8 inch diameter circular surface. This circular surface is the surface plated with nickel film 202. A cross sectional view along the dotted line A–A' through central raised portion 220 is shown in FIG. 3b. Referring to FIG. 3b, central raised portion 220 rises a distance a, which is 0.060 inch in this embodiment, above a base 221 of heat sink 201. Base 221 of heat sink 201 has a thickness b, which is 0.03 inch in this embodiment. The circular contour of central raised portion 220 is free of corners to avoid creating stress concentration points.

A mold-locking feature is provided by a number of raised conical protrusions (collectively labelled by reference numeral 203 in FIG. 3a) around the central raised portion 220. In addition, a through hole is provided in each corner of base 221. These through holes are collectively labelled by reference numeral 214 in FIG. 3a. Raised conical protrusions 203 and through holes 204 provide additional surface areas for locking plastic molding 204 onto heat sink 201. Heat sink 201's mold-locking features have resulted in excellent adhesion of the plastic molding 204 to heat sink 201, allowing package 200 to pass all the conventional tests including the thermal cycling, thermal shock, pressure pot, ink penetration and high humidity tests.

FIG. 4 is a bottom view of package 200 with plastic molding 204 removed so as to clearly show lead frame 205 and interposer ring 208. FIG. 4 shows the interposer ring sections 208a–208d downset and attached to the heat sink 201 with dielectric adhesive 213. Interposer ring sections 208a–208d are further supported by tie bars 241a–241d, which are imbedded in plastic molding 204. Lead frame 205 is severed to provide electrically isolated leads 250. Each of interposer ring sections 208a–208d is wire bonded to one of leads 250. Further, interposer ring sections 241b and 241d, which are dedicated for connections to a ground terminal, are electrically shorted to heat sink 201 via electrically conductive epoxy 240. Alternatively, spot welding or other suitable mechanism can be used to electrically short interposer ring sections 208b and 208d to heat sink 201. Interposer ring 208 is designed to surround semiconductor die 211 in close proximity without being in contact with semiconductor die 211. Consequently, very short wire bonds to both semiconductor die 211 and leads 250 are possible. Such wire bonds have low inductance which, in turn, reduces the parasitic impedances of package 200, thereby enhancing package 200's electrical performance. Interposer ring 208 provides an additional advantage in that each interposer ring section can be assigned for power or ground connection to any of leads 250 within the interposer ring section's proximity. As mentioned above, power and ground connections usually take about 25% of the total lead count in a conventional package. However, because the interposer ring sections are internal to package 200 and are accessed readily for connections, the number of leads on lead frame 205 required for power and ground connections is reduced, thereby effectively increasing the available lead count of package 200.

FIG. 5 shows the lower side of lead frame 205. Unlike conventional lead frames, lead frame 205 retains only the peripheral section of the conventional die attach pad to form interposer ring 208. When interposer ring 208 is divided into at two or more electrically isolated sections, these sections can be shorted at the designer's choice either to the heat sink as a ground connection, or to the power terminals.

FIG. 6 shows a top view of ceramic ring 206, showing the ceramic window 212 in which semiconductor die 211 and interposer ring sections 208a–208d are placed.

The above detailed description is provided to illustrate the specific embodiments of the present invention and is not intended to be limiting. Numerous modifications and variations within the scope of the present invention are possible. The present invention is defined by the following claims.

What is claimed is:

1. A plastic molded integrated circuit, comprising:
   a heat sink;
   an insulative layer attached to said heat sink, said insulative layer having an aperture exposing an area of said heat sink;
   a semiconductor die having a plurality of bonding pads, said semiconductor die being positioned within said aperture of said insulative layer and being attached to said heat sink at said exposed area;
   plurality of leads insulated from said heat sink by said insulative layer;
   a downset interposer ring positioned within said aperture between said semiconductor die and said plurality of leads;
   a first plurality of bond wires electrically connecting bonding pads on said semiconductor die to said downset interposer ring and said leads; and
   an encapsulation enclosing said insulative layer, said bond wires, said interposer ring, said semiconductor die and portion of said leads.

2. A plastic molded integrated circuit as in claim 1, wherein said insulative layer forms an annular ring.

3. A plastic molded integrated circuit as in claim 1, wherein said insulative layer is attached to said heat sink by an adhesive film.

4. A plastic molded integrated circuit as in claim 1, wherein said insulative layer is ceramic.

5. A plastic molded integrated circuit as in claim 1, wherein said insulative layer is polyimide.

6. A plastic molded integrated circuit, comprising:
   a heat sink having a base portion and a raised portion protruding above said base portion, said base portion having a lower surface and said raised portion having an upper surface;

a dielectric ring attached to said lower surface of said heat sink, said dielectric ring having an aperture exposing a portion of said lower surface of said heat sink;

a semiconductor die having a plurality of bonding pads attached to said exposed portion of said lower surface of said heat sink using a thermally conductive adhesive;

a plurality of leads electrically separated from said heat sink by said dielectric ring; a downset conductive interposer ring positioned within said aperture between said semiconductor die and said dielectric ring;

a plurality of bond wires connecting said bonding pads of said semiconductor die, said an encapsulation exposing said upper surface of said heat sink to the ambient and enclosing said base portion of said heat sink, said dielectric ring, said conductive interposer ring, a portion of said leads, and said semiconductor die.

7. A plastic molded integrated circuit as in claim 6, wherein said surface of said raised portion is free of corners.

8. A plastic molded integrated circuit as in claim 6, wherein said surface of said raised portion is circular.

9. A plastic molded integrated circuit as in claim 6, wherein said base portion further comprises a plurality of conical protrusions enclosed in said encapsulation.

10. A plastic molded integrated circuit as in claim 6, wherein said base portion oi said heat sink have a plurality of through holes filled by said encapsulation.

11. A plastic molded integrated circuit as in claim 6, wherein said dielectric ring is ceramic.

12. A plastic molded integrated circuit as in claim 6, wherein said dielectric ring is polyimide.

13. A plastic molded integrated circuit, comprising:

a stiffener;

an annular dielectric layer attached to said stiffener exposing a portion of said stiffener;

a semiconductor die having a plurality of bonding pads, said semiconductor die being attached by a thermally conductive adhesive to said exposed portion of said stiffener;

a plurality of leads electrically separated from said stiffener by said annular dielectric layer;

an interposer ring downset from said annular dielectric layer and positioned on said exposed portion of said stiffener between said semiconductor die and said annular dielectric layer;

a plurality of bond wires electrically connecting said bonding pads, said interposer ring and said leads; and an encapsulation enclosing said annular dielectric layer, said interposer ring, said bond wires, a portion of said leads, and said semiconductor die.

14. A plastic integrated circuit as in claim 13, wherein said interposer ring comprises a plurality of electrically isolated sections.

15. A plastic integrated circuit as in claim 14, wherein each of said electrically isolated section is supported in said encapsulation by tie bars.

16. A plastic integrated circuit as in claim 14, wherein one or more of said electrically isolated sections of said interposer ring is electrically shorted to said stiffener.

17. A plastic integrated circuit as in claim 14, wherein said one or electrically isolated sections are shorted to said stiffener by a layer of electrically conductive adhesive.

18. A plastic integrated circuit as in claim 14, wherein said electrically isolated sections of said interposer ring are electrically shorted to one or more of said leads.

* * * * *